United States Patent [19]

Sawano et al.

[11] Patent Number: 4,525,667
[45] Date of Patent: Jun. 25, 1985

[54] SYSTEM FOR OBSERVING A PLURALITY OF DIGITAL SIGNALS

[75] Inventors: Katsutoshi Sawano, Musashimurayama; Tetsuharu Miyashita, Hachioji, both of Japan

[73] Assignee: Iwatsu Electric Co., Ltd., Tokyo, Japan

[21] Appl. No.: 430,678

[22] Filed: Sep. 30, 1982

[30] Foreign Application Priority Data

Oct. 17, 1981 [JP] Japan .................................. 56-164937

[51] Int. Cl.³ ..................... G01R 15/12; G01R 23/16; G01R 7/00; G09F 9/30
[52] U.S. Cl. ................................. 324/140 R; 340/715; 364/487; 307/358; 324/73 R
[58] Field of Search ............... 324/73 R, 73 AT, 77 B, 324/158 R, 133, 140 R, 140 D; 364/481, 486, 487, 489, 551; 340/715; 307/358, 362

[56] References Cited

U.S. PATENT DOCUMENTS 4,390,837  6/1983  Hotvedt .......................... 324/73 R

FOREIGN PATENT DOCUMENTS 34903   9/1980  Japan .
623207  9/1978  U.S.S.R. ......................... 364/487

Primary Examiner—Gerard R. Strecker
Assistant Examiner—Warren S. Edmonds
Attorney, Agent, or Firm—Banner, Birch, McKie & Beckett

[57] ABSTRACT

A signal observation system for displaying a plurality of digital signals simultaneously on a CRT screen. The signals may be displayed individually or may be logically combined and displayed as the combination dependent on selected parameters, including the logic state of each signal and the direction of the transition when the logic level changes.

3 Claims, 12 Drawing Figures

Fig. 3A
PRIOR ART
CHANNEL
(1) 
(2) 
(3) 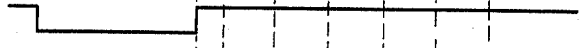
(4) 
(5) 
(6) 
(7) 
(8) 
Fig. 3B
PRIOR ART

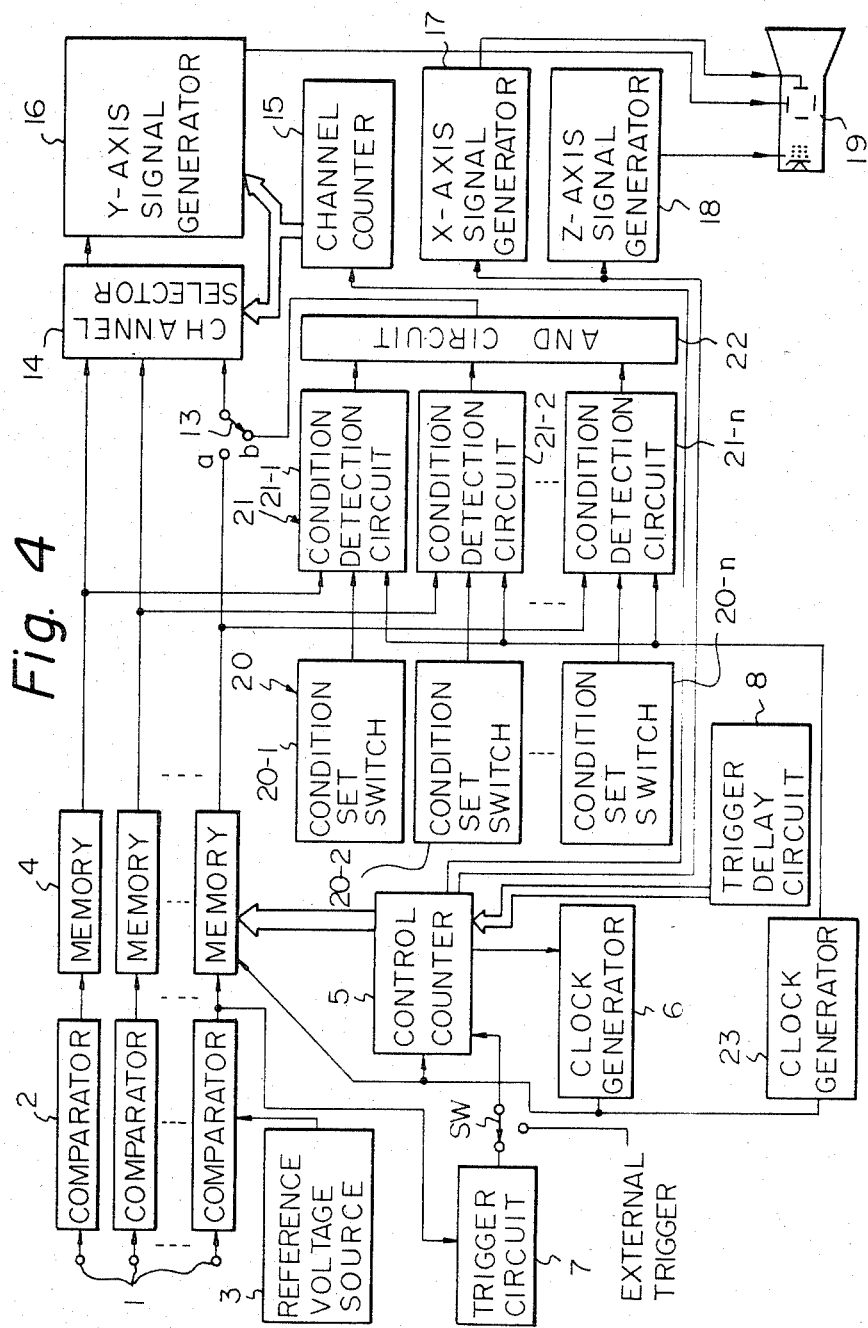

SYSTEM FOR OBSERVING A PLURALITY OF DIGITAL SIGNALS

BACKGROUND OF THE INVENTION

The present invention relates to a system for observing signal waveforms, and relates to such a system which is called a logic scope or a logic analyzer.

That kind of signal observation system has a memory for storing a signal to be observed, and displays a plurality of waveforms simultaneously on a CRT screen, therefore, that system is useful for the development of an electronic apparatus, and/or the maintenance or repair of such an apparatus.

The prior waveform observation system, or a logic analyzer has been shown in the Japanese patent publication No. 34903/80. FIG. 1 is the block diagram of that prior logic analyzer.

In FIG. 1, the reference numeral 1 is an input terminal for accepting signals or waveforms to be analyzed. The input terminal 1 has a plurality of terminals (for instance 8 terminals) in order to analyze simultaneously a plurality of waveforms. The reference numeral 2 is a comparator which compares the level of a signal of the input terminal 1 with the threshold level which is supplied by the reference voltage source 3, and said comparator 2 provides a digital output signal according to the result of the comparison. That comparator 2 is installed for each channel of the input waveforms. The reference numeral 4 is a memory for storing a digital output signal of said comparator 2, and said memory 4 is also provided for each channel. The memory 4 writes the signal with the writing clock signal generated by the clock signal generator 6, and reads the content repetitively with the reading clock signal. The reference numeral 5 is a control counter which provides the address information of the memory 4 according to the writing clock signal generated by the clock signal generator 6. That control counter 5 also provides a write-read switching signal after the predetermined delay time determined by the trigger delay circuit 8 when the trigger circuit 7 provides a trigger signal to said control counter 5. Said write-read switching signal is applied to the clock signal generator 6, and then, the writing clock phase is switched to the reading clock phase. The switch SW is provided in order to trigger the control counter 5 by an external trigger signal.

The reference numerals 10 and 11 are a condition set switch and a gate circuit (condition detection circuit), respectively, and are shown in FIG. 2 in detail. That condition set switch and gate circuit are provided for each channel. Each condition set switch (10-1, 10-2, . . . , 10-n) has a switch with three contacts, which correspond to (1) the logic value "1", (2) DONT CARE "X" which does not care whether the input digital value is "1" or "0", and (3) the digital value "1". The first and the third contacts "0" and "1" provide the digital value "0" when closed, and provide the digital value "1" when opened. The gate circuits (11-1, 11-2, 11-3, . . . , 11-n) which relate to the corresponding switches (10-1, 10-2, . . . , 10-n) function (1) to invert the output polarity of the memory 4, (2) to pass the output of the memory 4 without inverting the same, or (3) to stop the output of the memory 4 and prevent the same, according to the status of the switches 10. The AND circuit 12 functions to detect the data which satisfies the conditions defined by the switches 10.

The numeral 14 is a channel selector, which receives the outputs of the memory 4, and the output of the AND circuit 12 through the switch 13. The numeral 15 is a channel counter, which provides the channel selection signal to have the channel selector 14 select the designated channel and output the content of the memory 4, every time the control counter 5 designates the final address for each memory 4. The Y-axis signal generator 16 provides the Y-axis signal to the CRT 19 (cathode ray tube) according to the outputs of the channel selector 14 and the channel counter 15. The X-axis signal and the Z-axis signal are provided by the X-axis signal generator 17 and the Z-axis signal generator 18, respectively, according to the count content of the control counter 5.

It is supposed in FIG. 1 that the number of channels is 8. Each of the input signals at the input terminal 1 is compared with the threshold level in the comparators 2, and is converted to the digital value which takes 1 or 0. The converted value is sampled by each write clock signal, and the sampled values of 8 channels are stored in the memory 4 simultaneously. Upon the completion of the write operation to the memory 4, the trigger circuit 7 generates a trigger signal, which changes the operation mode from the write mode to the read mode, in which the content of the memory 4 is read out. When the switch 13 contacts the contact (a) in the read mode, the 8 channels of the data in the memory 4 are indicated on the screen of the CRT as shown in FIG. 3A.

Next, it is assumed that the switch 13 contacts the contact (b) in the indication status of FIG. 3A, and the switches (10-1, 10-2, . . . , 10-n) set the logic conditions of each channel. For instance, if the channels 1 and 3 are set to "1" by the switches 10, and other channels are set to "x" (don't care), then, the indication of the 8'th channel is replaced by the time sequence of FIG. 3B, which satisfies the logic conditions set by the switches 10.

Accordingly, said prior art of Japanese patent publication No. 34903/80 is useful to analyze the logic signals, and to find out the particular combination of the logic conditions.

However, said prior art has the disadvantages that the logic statuses to be analyzed are restricted only to "1", "0", and "x" (don't care), and the transition of the logic status (from "0" to "1", and from "1" to "0") is not detected. Thus, due to the lack of the detection of the logic changes, said prior apparatus is useless for some purposes.

SUMMARY OF THE INVENTION

It is an object, therefore, of the present invention to overcome the disadvantages and limitations of a prior logic analyzer by providing a new and improved logic analyzer.

It is also an object of the present invention to provide a logic analyzer which can detect the logical change of an input signal.

The above and other objects are attained by a logic analyzer comprising a plurality of input terminals for accepting digital input signals of a plurality of channels; a plurality of comparators each provided for each channel, for converting the input signals to the sampled digital signals; a plurality of memories each provided for each channel for storing the sampled digital signals of all the channels; means for reading out the content of said memories and displaying the same on a screen of a CRT display means; a plurality of condition set switches each provided for each channel being provided, and each condition set switch designating one of the "1" status, the "0" status, the "x" (don't care) status, the "up" status which shows the transition of the input signal from "0" to "1", and the "down" status which shows the change of the input signal from "1" to "0"; a plurality of condition detection circuits each provided for each channel being provided to detect if the signal status of each channel coinciding with the designated status which is set by the related condition set switch; an AND circuit for providing the logical product of all the outputs of said condition detection circuits; and a switch for selecting one of the output of said memories and the output of said AND circuit to display the output of the switch on the screen.

BRIEF DESCRIPTION OF THE DRAWINGS

The foregoing and other objects, features, and attendant advantages of the present invention will be appreciated as the same become better understood by means of the following description and accompanying drawings wherein:

FIG. 4 is a block diagram of the logic analyzer according to the present invention.

DESCRIPTION OF THE PREFERRED EMBODIMENTS

Figure 5:
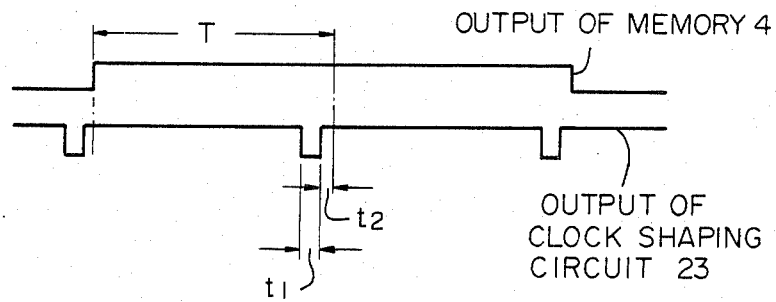
FIG. 5 shows an operational time chart showing the operation of the memory and the clock shaper circuit of FIG. 4.

FIG. 4 is the block diagram of the logic analyzer according to the present invention. The features of the embodiment of FIG. 4 are the presence of the logic condition set switches 20 which provide the logic conditions $a_n$ including (1) the logic "1", (2) the logic "0", (3) the logic "x" (don't care), (4) the logic "up" ( ↑ ) which shows the transition of the logic status from "0" to "1", and (5) the logic "down" ( ↓ ) which shows the transition of the logic status from "1" to "0", and the condition detection switches 21 which find out the position or the timing which satisfies the designated conditions. The logic condition set switches 20 are provided for each of the channels, and each switch may have one of said five logic conditions. The condition detection switches 21 correspond to the logic condition set switches 20, and said condition detection switches 21 also receive the output of the memory 4. Each of the condition detection switches 21 has flip-flops (explained later) which are reset every clock timing by the output of the clock shaping circuit 23. The clock shaping circuit 23 accepts the clock signal of the clock generator 6, and provides the shaped output which has the relations with the output of the memory 4 as shown in FIG. 5. In FIG. 5, the time duration T is the data read out duration for each clock, and said duration T is in the order of a micro second, the duration $t_1$ is the pulse width of the output of the clock shaping circuit 23, $t_2$ is the difference between the end of the duration T and the end of the output pulse of the clock shaping circuit 23. The duration $t_1$ is usually 10–50 ns for reseting said flip-flops, and the duration $t_2$ is 30–20 ns which is longer than the data setup time of said flip-flops.

The AND circuit 22 receives the outputs of the condition detection circuits 21, and detects the data which satisfies the conditions set by the switches 20.

Figure 6:
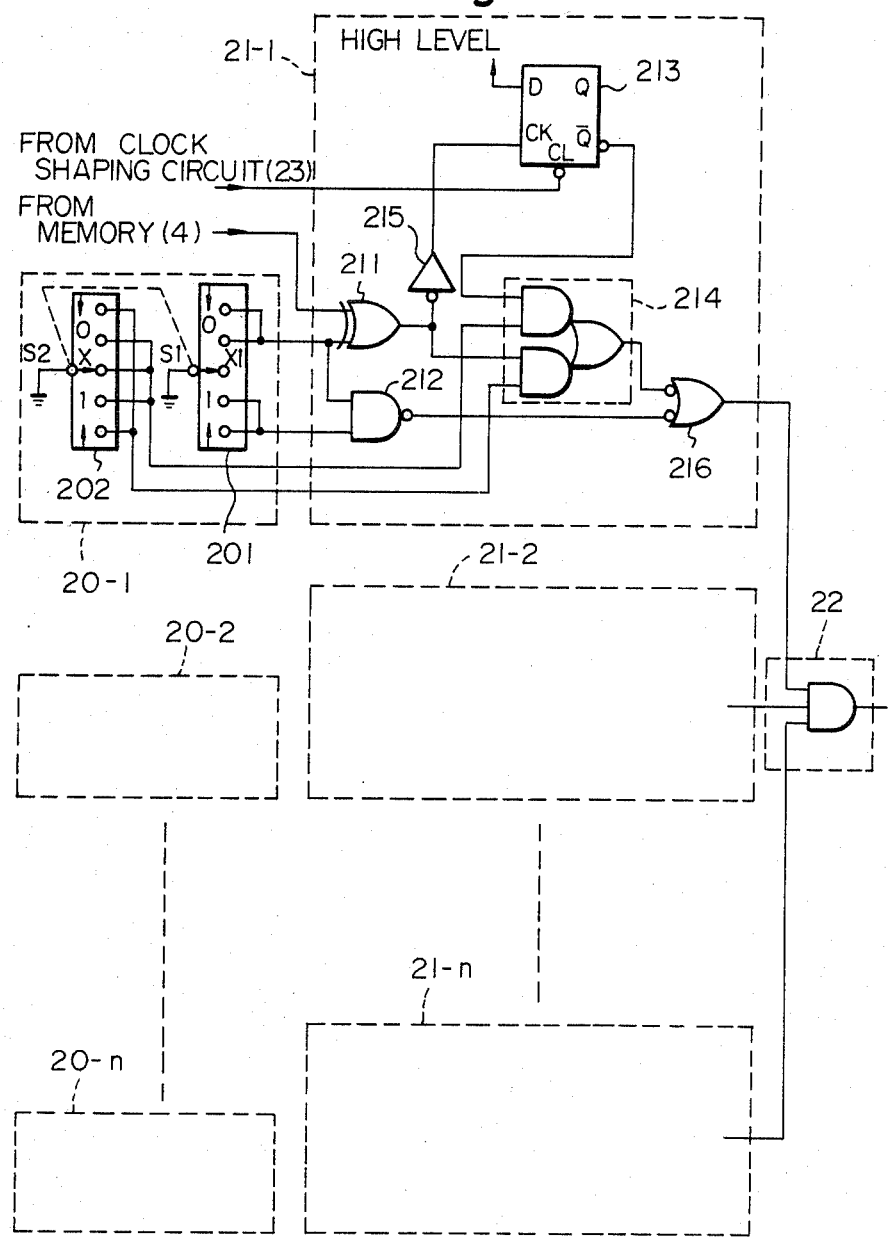
FIG. 6 is a detailed block diagram of the logic condition set switches and the condition detector of FIG. 4.

FIG. 6 shows the detailed block diagram of the switches 20 and the condition detection circuits 21. Those circuits are provided for each of the channels, and therefore, only the first ones 20-1 and 21-1 are shown in detail.

The switch 20-1 has a pair of contacts (201, 202) which relate to the five logic conditions ("1", "0", "x", "up", and "down"), and a pair of switches ($S_1$, $S_2$) for selecting one of said contacts. The contacts "down", "0" "x", "1", and "up" take the value 0 when the switches $S_1$ and $S_2$ contact to the related contact, and take the value 1 when said switches do not contact to the related contact.

The condition detection circuit 21-1 has the exclusive-OR circuit 211 which receives the output of the memory 4 and the contacts "down" and "0", the NAND circuit 212 which receives the contacts "down" and "0", and the contacts "1" and "up"; the D-type flip-flop 213 of a positive edge trigger type which receives the output of the exclusive-OR circuit 211 through the inverter 215 to the clock input terminal CK, and the output of the clock shaping circuit 23 to the negative clear input terminal $\overline{CL}$; the gate circuit 214 which receives the contacts 202, the output of the exclusive-OR circuit 211, and the $\overline{Q}$ output of the flip-flop 213, and passes the output of the exclusive-OR circuit 211 when "0", "x" or "1" is selected, and passes the $\overline{Q}$ output of the flip-flop 213 when "up" or "down" is selected; and the NOR circuit 216 which receives the output of the gate circuit 214 and the output of the NAND circuit 212. The outputs of the NOR circuits 216 of each of the detection circuits (21-1, 21-2, . . . , 21-n) are applied to the AND circuit 22, the output of which is applied to the channel selector 14 through the selection switch 13.

Figure 1:
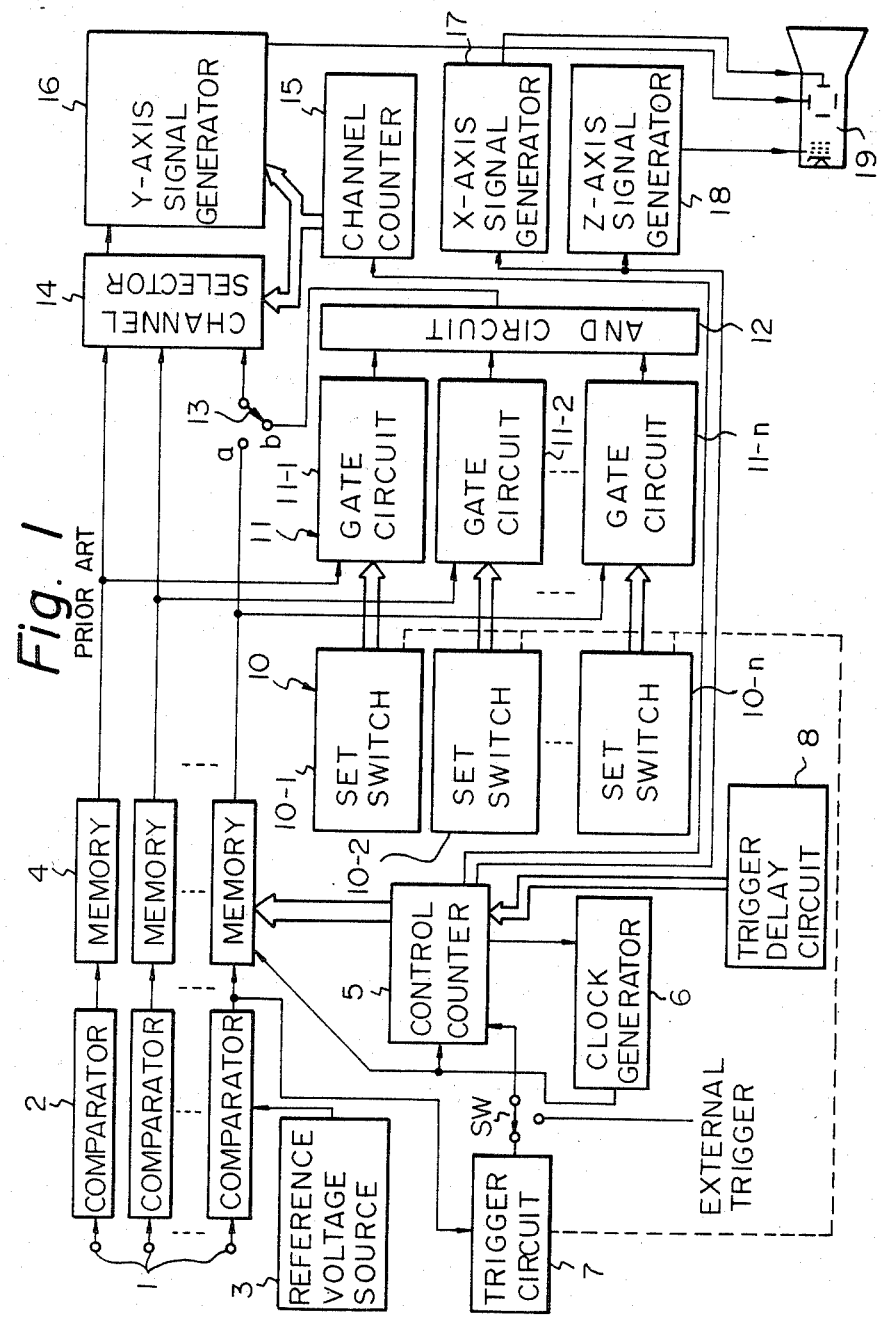
FIG. 1 is a block diagram of a prior logic analyzer.
Figure 2:
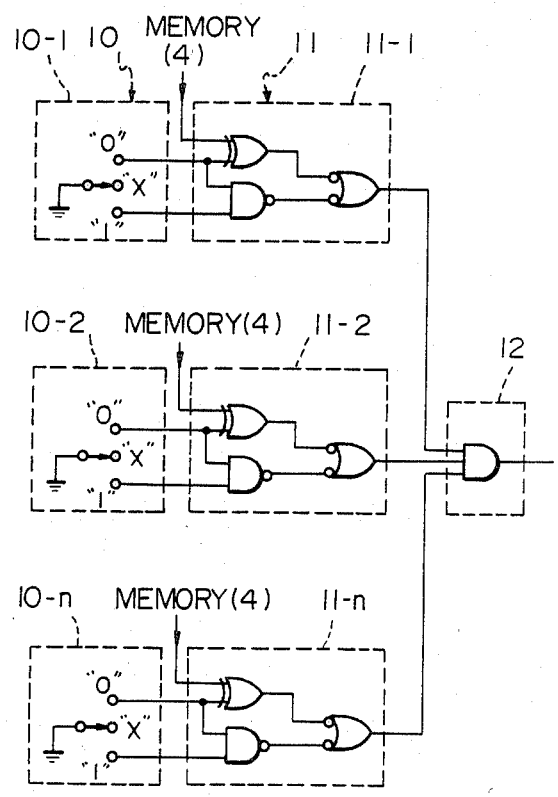
FIG. 2 is a detailed block diagram of the condition set switches 10 and the gate circuit 11 in FIG. 1, FIGS. 3A and 3B are output waveforms of the apparatus of FIG. 1.

In the above configuration, when the logic condition set switch 20-1 contacts to the contact "0", "x" or "1", the gate circuit 214 passes the output of the exclusive-OR circuit 211, and the operation of the circuit is the same as that of FIG. 1, and in this case, the data satisfying the conditions are applied to the AND circuit 22.

On the other hand, when the switch 20-1 contacts to the contact "up" or "down", the gate circuit passes the $\overline{Q}$ output of the flip-flop 213. When the "down" from the level "1" to the level "0" is selected, the contact "down" takes the level 0, and then, the output of the memory 4 passes the exclusive-OR circuit 211, the sign of the same is inverted by the inverter 215, and then, the inverted signal is applied to the clock input terminal CK of the flip-flop 213. Thus, the $\overline{Q}$ output of the flip-flop is inverted, that is to say, when the level of the data of the memory 4 changes from "1" to "0", the $\overline{Q}$ output of the flip-flop 213 changes from 1 to 0.

Figure 7:
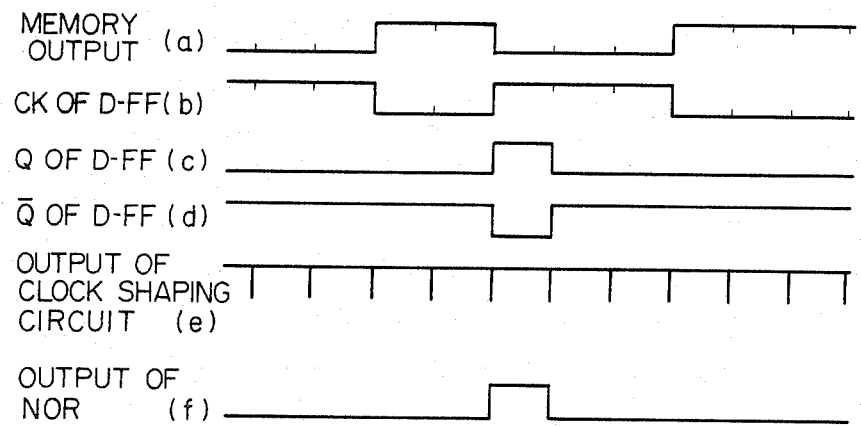
FIG. 7 shows the operational time charts of the flip-flop of FIG. 6.

FIG. 7 shows the operational time chart of the D-type flip-flop, and the curve (a) is the output of the memory, (b) is the input of the clock terminal CK of the flip-flop, (c) is the Q output, (d) is the $\overline{Q}$ output, (e) is the output of the clock shaping circuit 23 applied to the clear input terminal $\overline{CL}$ of the flip-flop, (f) is the output of the NOR circuit 216. As apparent from FIG. 7, the $\overline{Q}$ output of the flip-flop changes according to the transient of the output of the memory 4, and said $\overline{Q}$ output is applied to the NOR circuit 216 through the gate circuit 214. The NOR circuit 216 receives also the output of the NAND circuit 212, and inverts the signal $\overline{Q}$ as shown in FIG. 7(f), and applied the condition detection signal to the AND circuit 22. In the above operation, the output (FIG. 7(e)) of the clock shaping circuit 23 is applied to the clear terminal $\overline{CL}$ of the flip-flop, and therefore, the status of the flip-flop returns to the original status ("1") after one clock duration. In another word, the $\overline{Q}$ output of the flip-flop is inverted only in one clock interval when the output of the memory 4 satisfies the designated conditions.

The operation when the "down" is designated is described above. The operation when the "up" is designated is similar except that the output of the memory is inverted by the exclusive-OR circuit 211. In the "up" condition, the $\overline{Q}$ output of the flip-flop 213 changes when the output of the memory changes from 0 to 1.

Although the above explanation is carried out for the switch 20-1 and the condition detection circuit 21-1, other switches (20-2, ..., 20-n), and the condition detection circuits (21-2, ..., 21-n) operate similarly. Accordingly, by providing the logic statuses by the switches (20-1, 20-2, ..., 20-n), the timing position which satisfies all the logic conditions designated by the switches is detected.

Figure 8:
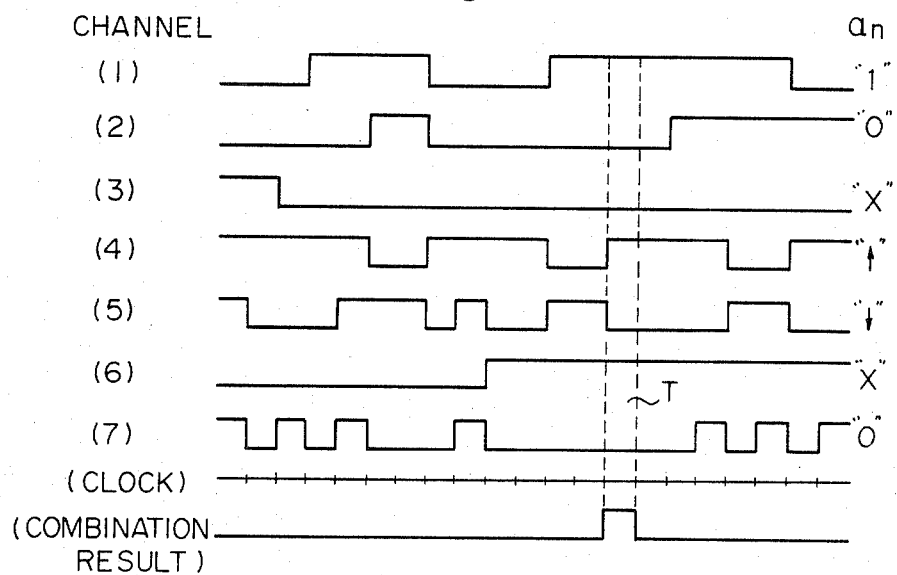
FIG. 8 shows the example of the output indication of the apparatus of FIG. 4.

FIG. 8 shows the example of the operation of the multi-channels, in which 8 channels of signals are indicated on the screen. In this case, the 8'th channel is not indicated on the screen since the switch 13 in FIG. 4 is connected to the contact (b). In FIG. 8, it is assumed that the logic conditions $a_n$ for the channels are $a_1$="1", $a_2$="0", $a_3$="x", $a_4$="up", $a_5$="down", $a_6$="x", $a_7$="0", and $a_8$="x", the bit position which satisfies all the above conditions is indicated on the 8'th track as the result of the combination. It should be appreciated in FIG. 8 that the signals in each of the channels in the interval T which provides the combination result, satisfying the above conditions. The clock signals in FIG. 8 are not indicated on the screen, but those clock signals are shown in the drawing for the sake of the easy understanding of the explanation.

Figure 9:
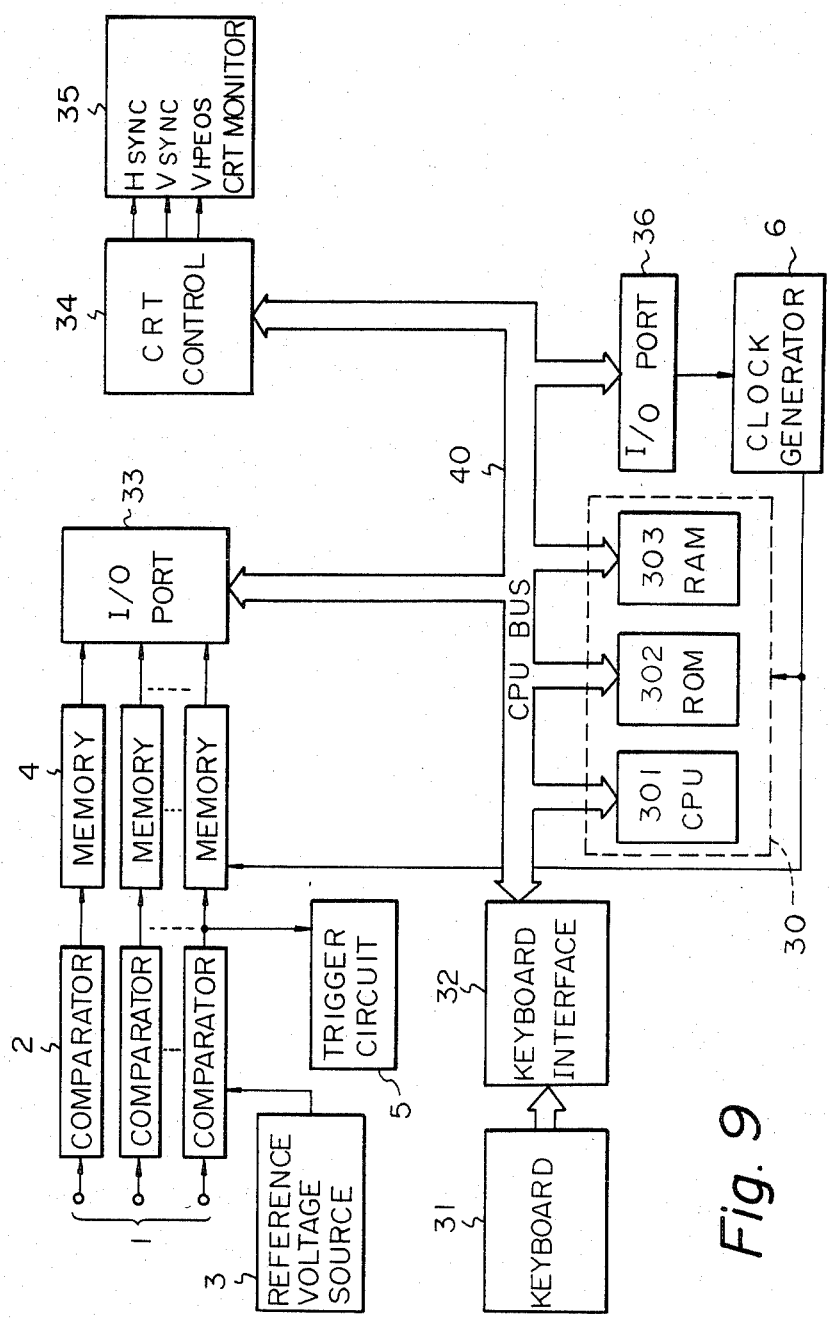
FIG. 9 is the block diagram of the other embodiment of the logic analyzer according to the present invention.

FIG. 9 shows the block diagram of the other embodiment of the logic analyzer according to the present invention. The embodiment of FIG. 9 performs the same function as that of FIG. 4, by using a micro-computer system. The same numeral in FIG. 9 as that in FIG. 4 shows the same member as that of FIG. 4.

In FIG. 9, the numeral 30 is a control, which includes a micro-processor 301, a ROM (read only memory) 302 for storing the program for the operation of the processor 301, a RAM (random access memory) 303, and some other components consisting of a microcomputer system like a decoder. The numeral 31 is a keyboard for inputing logic conditions $a_n$, 32 is a keyboard interface for coupling the keyboard 31 with the computer system, 33 is an I/O port for coupling memories 4 with the computer bus 40, 34 is a CRT control, 35 is a CRT monitor screen, 36 is an I/O port for applying a write-read switching signal to the clock generator 6. It is supposed that the computer BUS 40 includes the data bus for the data transfer among the sections, the address bus, the read control line, the write control line, and the chip-select line.

In the above configuration, when the signals to be analyzed are applied to the input terminals 1, those signals are stored in the memory 4 through the comparator 2, as similar to the previous embodiment. When the data of all the channels are stored in the memory 4, the I/O port 36 provides a switching signal from the write mode to the read mode, and then, the content of the memory 4 is read out, and the data thus read out is transferred to the RAM 303.

Figure 10:
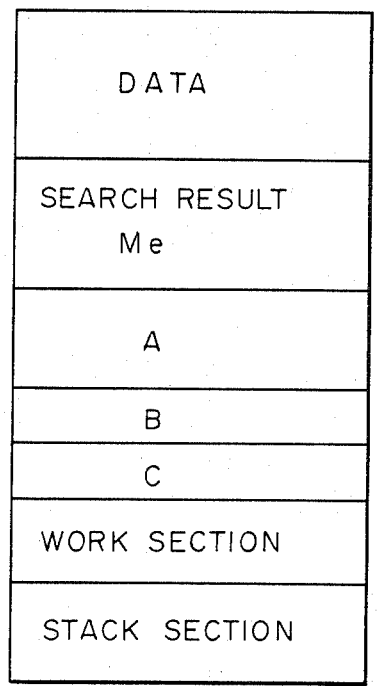
FIG. 10 is the memory map of the RAM of FIG. 9.
Figure 11:
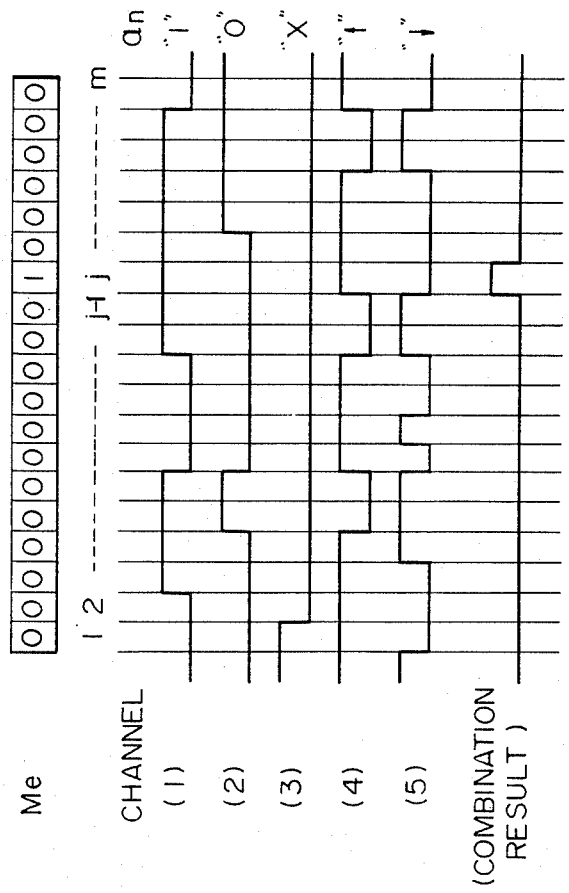
FIG. 11 is the explanatory drawing of the operation of the apparatus of FIG. 9.

The RAM 303 has a plurality of sections for storing the data of the memory 4, the section Me for storing the search result, the area A for storing the effective train of bytes $A_n$ of the combined logic condition $a_n$, the sections B and C for storing the result of the comparison, and other miscellaneous work area and/or stack area, as shown in FIG. 10. The section Me stores as shown in FIG. 11 the logical product of the designated condition $a_n$, and the input data $b_{ij}$ (i=1−n, n is the number of channels, j=1=m, m is the memory length) for every clock interval. In the embodiment of FIG. 11, the j'th bit of the section Me is 1, and other bits are zero. The section A stores the combined logic conditions $a_n$ in the form of the byte train $A_n$ defining the said combined logic conditions.

When the logic conditions $a_n$ are provided by the keyboard 31 to each of the channels, the conditions are encoded to the byte train $A_n$, which is stored in the section A. Next, the control 30 derives the input data $b_{ij}$ to be searched in the RAM 303, then, the input data $b_{ij}$ is compared with the logic conditions. When the comparison result is "no", the data "0" is stored in the related bit of the section Me, and when the comparison result is "yes", the data "1" is stored in the related bit of the section Me. The search result or the comparison result is indicated on the screen of the CRT monitor 35 through the CRT control 34, together with the input data of each of the channels.

The comparison of the input data $b_{ij}$ to be searched with the logic conditions $a_n$ is accomplished as follows.

It is assumed in FIG. 11 that there are five channels (1) through (5), and the logic conditions $a_n$ of the channels are "1", "0", "x", "up", and "down", respectively.

First, the temporary logic condition $d_n$ is defined by replacing "up" to "1", and "down" to "0". Then, $d_n$ is shown below.

$$d_n = 10 \times 10$$

(note: $a_n = 10 \times$ up down)

Then, the second temporaty condition $a_n^x$ (in the original condition $a_n$) is defined by replacing the don't care (x) to "0" as follows.

$$a_n^x = 11011$$

The input data $b_{ij}$ at the j'th bit position of FIG. 11 to be transferred to the RAM 303 is shown below.

$$b_{ij} = 10010$$

Then, the $d_n$ and $b_{ij}$ are masked by $a_n^x$ since "don't care" needs not to be considered.

$$d_n' = d_n \text{ AND } a_n^x = 10010$$

$$b_{ij}' = b_{ij} \text{ AND } a_n^x = 10010$$

Then, $d_n'$ is compared with $b_{ij}'$ as follows.

$$d_n' \text{ ExOR } b_{ij}' = 00000$$

Therefore, when all the bits of said comparison are zero's, the input data $b_{ij}$ satisfies the condition $a_n$. When the input data satisfies the condition $a_n$, the data '1' is stored in the section B, and when the input data does not satisfy the conditions, the data '0' is stored in the section B. Thus, the section B stores the result whether or not the input data satisifes the conditions.

However, it should be noted that the above procedure does not indicate the transition ("up" and/or "down"). Therefore, the search for the indication of that transfer is performed.

In this procedure, the temporary condition $f_n$ is provided by replacing "up" and "down" to "1" in the original condition $a_n$.

$$f_n = 00011$$

In order to find the transition "up" or "down", the input data $b_{i(j-1)}$ of the previous clock interval is tested.

$$b_{ij} = 10010$$

$$b_{i(j-1)} = 10001$$

It should be noted that when the data of the previous clock interval is different from the data of the present clock interval, there exists a transition or a data change in the related channel. In order to search only the channels in which "up" or "down" is designated, the data $b_{ij}$ and $b_{i(j-1)}$ are masked by $f_n$ as follows.

$$b_{ij}' = b_{ij} \text{ AND } f_n = 00010$$

$$b'_{i(j-1)} = b_{i(j-1)} \text{ AND } f_n = 00001$$

Then, those two values are compared through the exclusive-OR procedure as follows.

$$g_n = b_{ij}' \text{ ExOR } b_{i(j-1)}' = 00011$$

The pulse train $g_n$ clarifies the transition of data between the previous clock interval and the present clock interval. In the above embodiment of $g_n$, the pulse train $g_n$ shows that there exists the transition which satisfies the conditions of $a_n$ in the channels (4) and (5).

Next, the exclusive-OR logic is accomplished between $f_n$ and $g_n$ in order to test if all the bit conditions are satisfied. The result is 0 (in all bits) when all the conditions are satisfied. When all the bits is 0 which shows the existence of the transition, the data "1" is stored in the section C, and if there is no transition (when all the bits of $g_n$ is zero), the data '0' is stored in the section C.

Finally, the logical product of the content of the section B and the content of the section C is accomplished. When the result of the logical product is '1', the data '1' is stored in the bit position of the section Me related to the bit position of the input data $b_{ij}$. In the present embodiment of FIG. 11, the content of the section B is "1", and the content of the section C is "1", thus, the logical product is '1', and then, the data '1' is stored in the j'th bit of the section Me.

The above procedure is accomplished to all the bit positions of the input data $b_{ij}$, and the result is stored in the section Me. The content of Me is indicated on the screen on a time-axis (combination result), and therefore, the bit position that the input data satisfies the designated conditions is indicated on the screen.

Some modifications of the above embodiments are possible of course. For instance, the result of the combination result may be indicated by a low level, intensity modulation, a specified mark, et al, instead of a high level of FIG. 11. Further, the indication by binary value or hexadecimal value, instead of a timing indication may be possible.

As described above in detail, the additional logic conditions "up" and "down" which indicate the transition or the change from '0' to '1', or from '1' to '0' may be detected together with the logic conditions '1', '0', 'don't care'. Therefore, the present analyzer is useful for analyzing a digital signal for the research laboratory work, and/or field maintenance work.

From the foregoing it will now be apparent that a new and improved logic analyzer has been found. It should be appreciated of course that the embodiments disclosed are merely illustrative and are not intended to limit the scope of the invention. Reference should be made to the appended claims, therefore, rather than the specification as indicating the scope of the invention.

What is claimed is:

1. A signal observation system for analyzing digital signals, said system comprising:
  a plurality of signal channels, each of said signal channels including:
    input terminal means for receiving a digital signal;
    comparator means coupled to said input terminal means for comparing the digital signal received by said input terminal means to a reference signal and producing a bistable logic signal in response to the comparison;
    memory means coupled to said comparator means for storing said bistable logic signal;
    switch means for providing a condition signal selected from among a plurality of condition signals, said plurality of condition signals including a logic "0" signal, a logic "1" signal, a logic "don't care" signal, a logic "UP" signal indicating a logic transition from "0" to "1" and a logic "DOWN" signal indicating a logic transition from "1" to "0", said switch means having a switch contact associated with each of said logic signals; and
    condition detecting means coupling to said memory means and said switch means for comparing the bistable signal stored in said memory means to said condition signal and producing a coincidence signal when said bistable signal and said condition signals match;
  logic means coupled to said condition detecting means of each of said plurality of signal channels for producing a logic signal in response to the logical product of said coincidence signals;
  selecting means coupled to one of said memory means and to said logic means for providing an output signal selected from among the bistable signal stored in said one memory means and the logic signal produced by said logic means; and
  display means coupled to the other of said memory means and to said selecting means for displaying the bistable signal stored in said other memory means and the output signal provided by said switch means.

2. The signal observation system of claim 1 wherein:
each of said condition detecting means includes an exclusive OR gate having a first input coupled to said memory means and a second input coupled to the logic "0" switch contact of said switch means and the logic "DOWN" switch contact of said switch means;
a logic NAND gate having a first input coupled to said second input of said exclusive OR gate and a second input coupled to the logic "1" switch contact of said switch means and the logic "UP" switch contact of said switch means;
a flip/flop circuit coupled to the output of said exclusive OR gate, said flip/flop circuit changing bistable state in response to the output of said exclusive OR gate;
a gate circuit having a first input coupled to the output of said exclusive OR gate, a second input coupled to the output of said flip/flop circuit, a third input coupled to the "0", "don't care" and "1" switch contacts of said switch means and a fourth input coupled to the "DOWN" and "UP" switch contacts of said switch means, said gate circuit producing an output logic level corresponding to the output logic level of said exclusive OR gate when said condition signal is selected from among a logic "0" signal, a logic "don't care" signal and a logic "1" signal, said gate circuit producing an output logic level corresponding to the output logic level of said flip/flop circuit when said condition signal is selected from among a logic "UP" signal and a logic "DOWN" signal; and
a NOR gate having a first input coupled to the output of said gate circuit and a second input coupled to the output of said NAND gate, said coincidence signal being taken from the output of said NOR gate.

3. A signal observation system for analyzing digital signals, said system comprising:
a plurality of input terminals for receiving digital signals;
comparator means coupled to each of said terminals for comparing the digital signals received by each input terminal with a reference signal and producing a respective bistable signal in response to the comparison;
memory means coupled to each of said comparator means for storing said bistable signal;
keyboard means having a plurality of keys for selecting a condition signal for each respective input terminal of said plurality of input terminals from among a plurality of logic signals including a logic "0" signal, a logic "1" signal, a logic "don't care" signal, a logic "UP" signal indicating a logic transition from "0" to "1" and a logic "DOWN" signal indicating a logic transition from "1" to "0", said condition signal being provided by activating predetermined keys of said plurality of keys which correspond to respective said logic signals;
a memory device coupled to said keyboard means for storing said condition signals;
programmable processing means coupled to said memory device and each of said memory means for comparing the condition signals stored in said memory device to the bistable signals stored in said memory means and determining when said condition signals match respective said bistable signals and producing a detection signal associated with such match, logically combining said detection signals and storing the result in said memory device; and
display means coupled to said memory device for displaying the contents of said memory device.

* * * * *